United States Patent [19]
Okamoto

[11] Patent Number: 6,054,358
[45] Date of Patent: Apr. 25, 2000

[54] SEMICONDUCTOR DEVICE AND MANUFACTURING METHOD OF THE SAME

[75] Inventor: Tetsumasa Okamoto, Tokyo, Japan

[73] Assignee: NEC Corporation, Tokyo, Japan

[21] Appl. No.: 09/137,421

[22] Filed: Aug. 20, 1998

[30] Foreign Application Priority Data

Aug. 20, 1997 [JP] Japan ..................... 9-223640

[51] Int. Cl.⁷ .................................. H01L 21/331
[52] U.S. Cl. .................. 438/309; 438/320; 438/366
[58] Field of Search ........................ 438/320, 366, 438/391, 367, 309

[56] References Cited

U.S. PATENT DOCUMENTS

| | | | |
|---|---|---|---|
| 4,975,381 | 12/1990 | Taka et al. | 438/367 |
| 5,296,391 | 3/1994 | Sato et al. | 438/341 |
| 5,365,090 | 11/1994 | Taka et al. | 257/197 |
| 5,432,104 | 7/1995 | Sato | 438/366 |
| 5,599,723 | 2/1997 | Sato | 438/320 |

FOREIGN PATENT DOCUMENTS

61-99374  5/1986  Japan .
3-22438   1/1991  Japan .

*Primary Examiner*—John F. Niebling
*Assistant Examiner*—Christopher Lattin
*Attorney, Agent, or Firm*—McGinn & Gibb, P.C.

[57] ABSTRACT

A partial oxide film on a base region is removed to form an opening, a polycrystalline silicon film is deposited directly thereon, and by dry etching, the polycrystalline silicon film is divided into a region including an impurity of same conductive type as the base, and a region including an impurity of reverse conductive type of the base. By heat treatment, the impurity is diffused from the polycrystalline silicon film into the base region, and an external base diffusion layer and an emitter diffusion layer are formed. In succession, the surface of the polycrystalline silicon film is formed into polyside film to lower the resistance, and by using the polycrystalline silicon film as emitter electrode and base electrode, a fine base and emitter area is realized.

3 Claims, 9 Drawing Sheets

SEMICONDUCTOR DEVICE AND MANUFACTURING METHOD OF THE SAME

BACKGROUND OF THE INVENTION

1. Field of the Invention

The present invention relates to a semiconductor device and manufacturing method of the same, and more particularly to a device structure of bipolar transistor having a fine emitter area and base area and capable of integrating to high density and manufacturing method of the same.

2. Prior Art

Figure 1A:
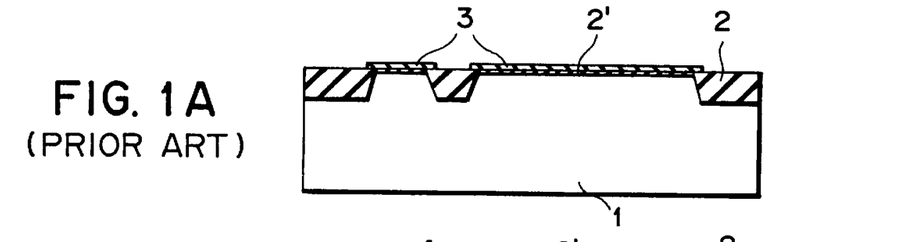

FIG. 1A to FIG. 1F are sectional views showing a method of manufacturing a conventional bipolar transistor, in particular, an NPN transistor in the sequence of steps, and FIG. 2A to FIG. 2F are plan views of FIG. 1A to FIG. 1F, respectively. FIG. 1A is a sectional view along line A—A in FIG. 2A, and FIG. 1B to FIG. 1F are also sectional views at same position as line A—A in FIG. 2A.

Figure 2A:
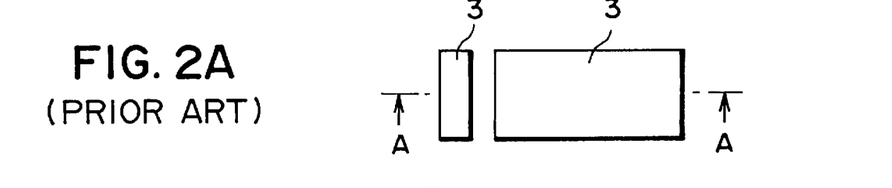

As shown in FIG. 1A and FIG. 2A, a part of a P type semiconductor substrate 1 is selectively oxidized so that a field region 2 is formed by thermal oxidation using a silicon nitride film 3 as mask. Reference numeral 2' is a pad oxide film.

Figure 1B:
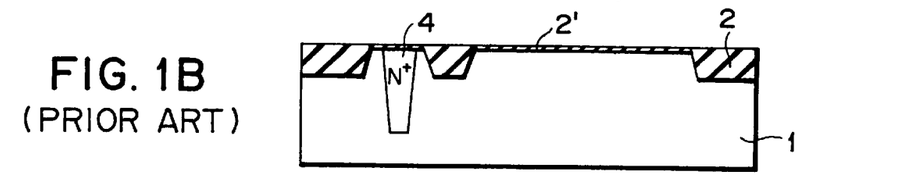
Figure 2B:
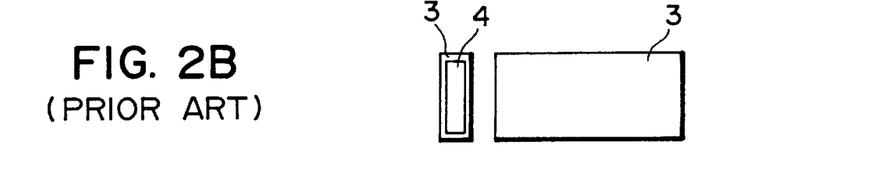

Consequently, as shown in FIG. 1B and FIG. 2B, after removing the silicon nitride film 3 from the surface of the substrate 1, using the resist formed by photolithographic technology as mask, an N type impurity, especially, phosphorus is injected by ion implantation. Then, after removing the resist, heat treatment is conducted to form an $N^+$ collector draw-out region 4 having a junction depth of 1 to 1.5 μm.

Figure 1C:
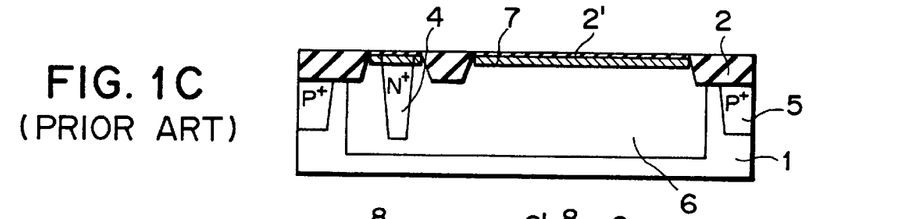
Figure 2C:
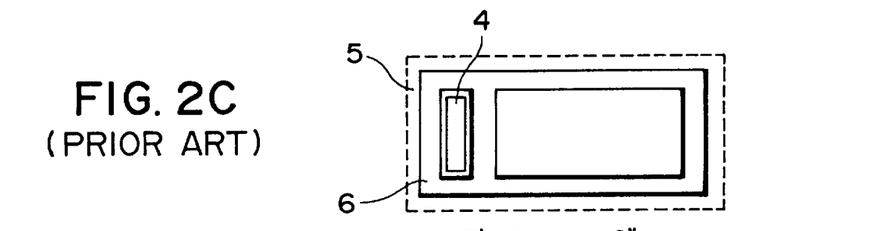

Then, as shown in FIG. 1C and FIG. 2C, using other resist as mask, boron is injected by ion implantation as a P type impurity, and after removing the resist, heat treatment is conducted to form a P type element separation region 5. In succession, by using photo resist as mask, phosphorus is injected by using a high acceleration ion implantation apparatus of 1 to 1.5 mega-electron-volts (MeV), and an N well region 6 is formed. After removing the photo resist, by injecting boron in the entire surface of the substrate 1, a base diffusion layer 7 is formed in a range enclosed by the field region 2. In this process, similar boron is injected also onto the collector draw-out region 4, but since the concentration difference is more than 100 times, it has almost no effect.

Figure 1D:
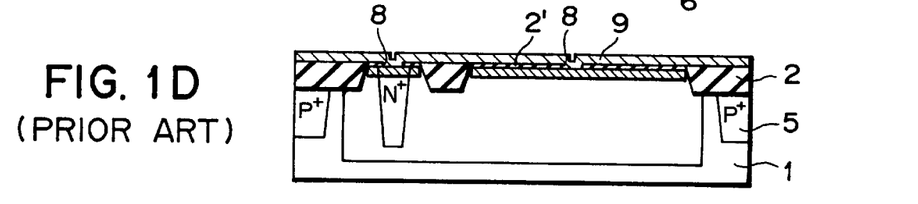
Figure 2D:
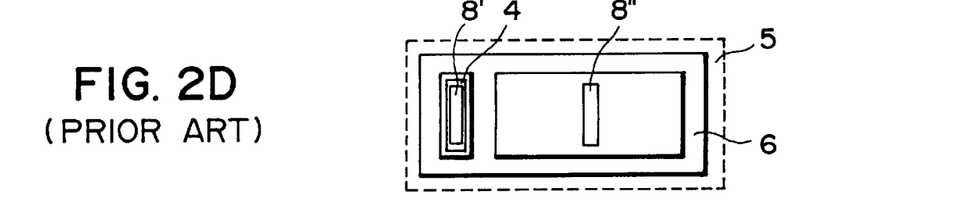

Next, as shown in FIG. 1D and FIG. 2D, part of the pad oxide film 2' of the collector part and emitter part is removed by dry or wet etching, using photo resist formed by photolithographic technology as mask, and openings (contacts) 8', 8" are formed. After removing the resist, polycrystalline silicon film 9 of 1000 to 2000 Å is formed by chemical vapor deposition (CVD). Then, arsenic ions (As) of $1 \times 10^{16}$ to $3 \times 10^{16}$ cm$^{-2}$ are implanted into the entire surface of the substrate 1 and injected into the polycrystalline silicon film 9.

Figure 1E:
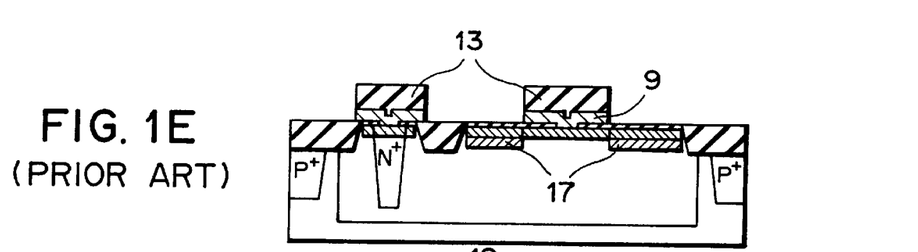
Figure 2E:
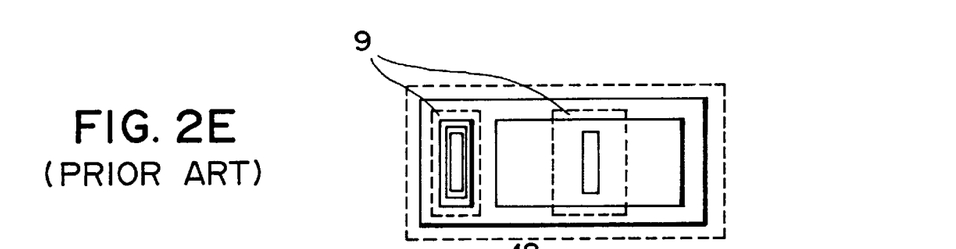

As shown in FIG. 1E and FIG. 2E, using a new photo resist 13 as mask, other area than specified regions for emitter and collector of the polycrystalline silicon film 9 is removed. In succession, by ion implantation of high concentration boron, using photo resist as mask, an external base region 17 of low resistance is formed. In this case, the energy of ion implantation must be set to such a level that impurity ions may not pass through the field thermal oxide film.

Figure 1F:
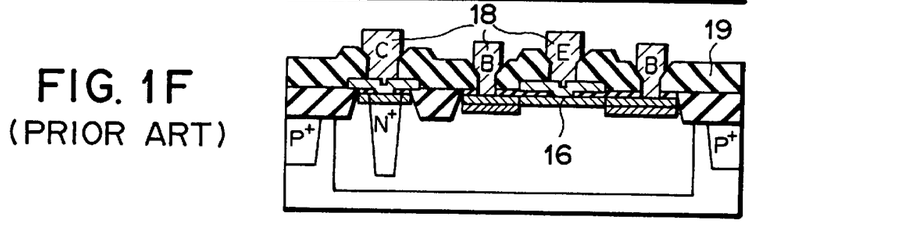
Figure 2F:
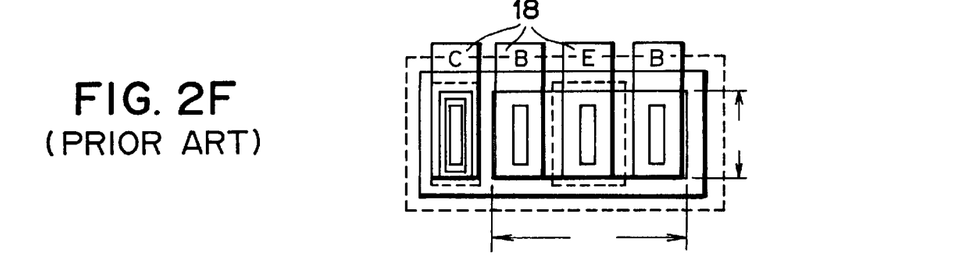

Then, as shown in FIG. 1F and FIG. 2F, after removing the resist, non-doped oxide film and boron- and phosphorus-doped oxide film (BPSG) are sequentially formed by chemical vapor deposition, and an interlayer film 19 is formed. By heat treatment of furnace annealing or lamp annealing of 900 to 1000° C., an emitter diffusion layer 16 is formed.

Successively, by etching the interlayer film 19 formed of BPSG/SiO$_2$ on specified region by using the resist formed by photolithographic technology as mask, an opening (contact) for metal wiring connection is formed. Finally, removing the resist, an aluminum alloy containing copper is formed by sputtering method, and by dry etching using the resist as mask, a metal wiring 18 is formed.

Figure 3A:
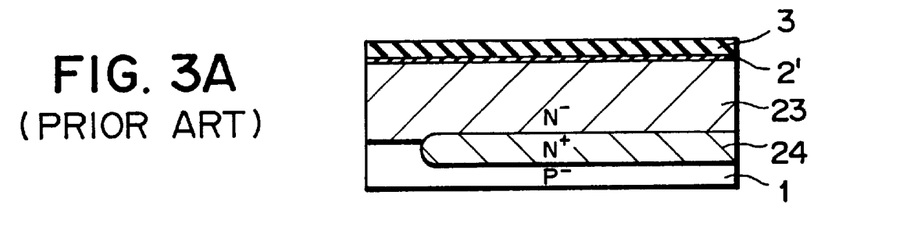

A conventional manufacturing method by using a self-matching technology is described below. As shown in FIG. 3A, an $N^+$ buried diffusion layer 24 is formed on a P type semiconductor substrate 1, and after forming an $N^-$ type epitaxial layer 23 on the semiconductor substrate 1 by epitaxial technology, a pad oxide film 2' is formed, and a silicon nitride film 3 is formed on its surface.

Figure 3B:
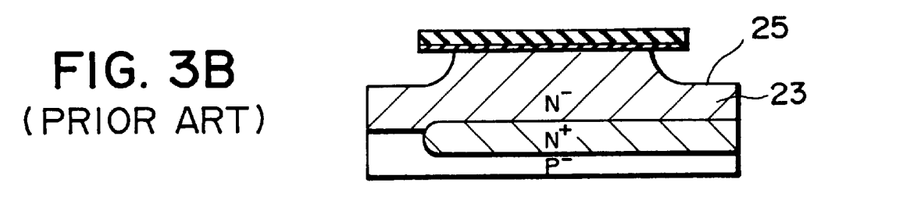

Then, as shown in FIG. 3B, a resist is formed on the nitride film 3 by a known photolithographic technology, and, using it as mask, the silicon nitride film 3 and pad oxide film 2' are etched. Using the remaining pad oxide film 2' and silicon nitride film 3 as mask, the $N^-$ type epitaxial layer 23 is selectively etched, and a groove 25 is formed at a position for forming an element separation oxide film.

Figure 3C:
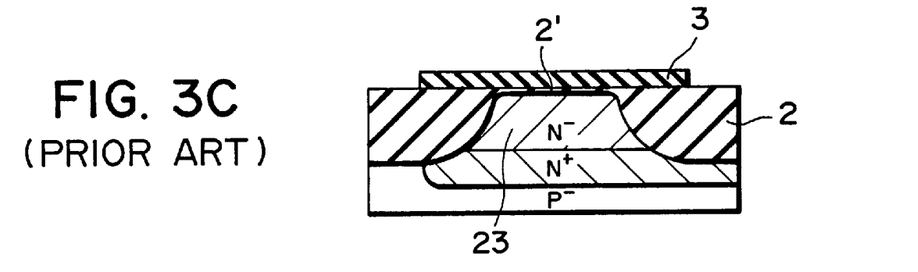

Next, as shown in FIG. 3C, by thermal oxidation, a thick element separation oxide film 2 made of silicon oxide film layer is formed in the groove 25. After removing the nitride film used as anti-oxidation mask, although not shown, by ion implantation of phosphorus by using resist as mask, a collector draw-out region is formed same as in prior art 1.

Figure 3D:
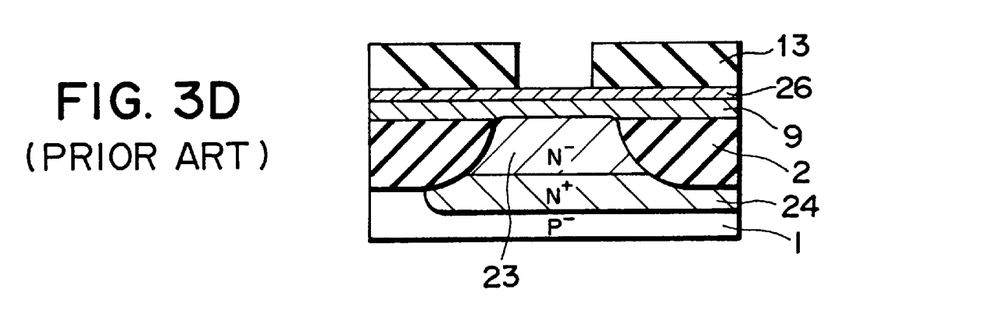

After removing the pad oxide film 2' as shown in FIG. 3D, a first polycrystalline silicon film 9 is formed on the entire surface of the substrate 1. By thermal oxidation, a polycrystalline silicon oxide film 26 is formed on the surface of the first polycrystalline silicon film 9.

Figure 3E:
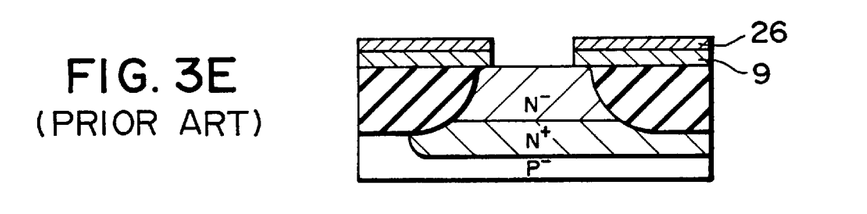

Consequently, as shown in FIGS. 3D and 3E, after ion implantation of boron into the first polycrystalline silicon film 26, by anisotropic etching by using a resist 13 formed by photolithographic technology as mask, the polycrystalline silicon oxide film 26 and polycrystalline silicon film 9 are etched successively.

Figure 3F:
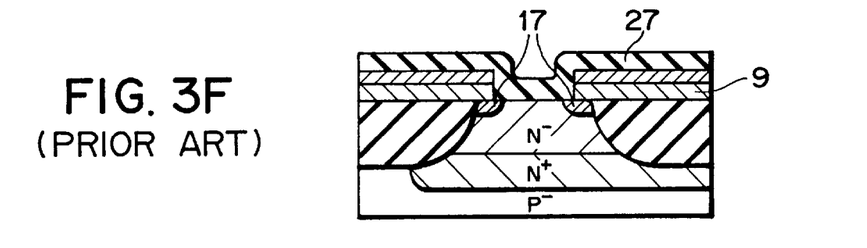

Then, as shown in FIG. 3F, after thinly oxidizing the surface exposed by anisotropic dry etching, a CVD oxide film 27 is formed on the entire surface of the substrate. At this time, in the end portion of contacting side of the polycrystalline silicon film 9, boron is diffused outward of the polycrystalline silicon film 9, and an external base diffusion region 17 of high concentration is formed.

Figure 3G:
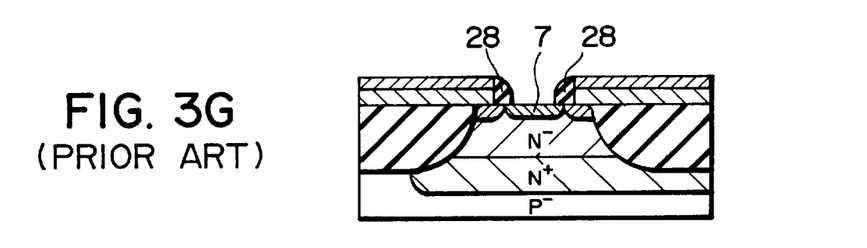

As shown in FIG. 3G, by anisotropic etching, the CVD oxide film 27 is etched, and a side wall 28 of the CVD oxide film 27 is formed. By ion implantation of boron through an opening narrowed by this side wall 28, a base region 7 is formed by heat treatment.

Figure 3H:
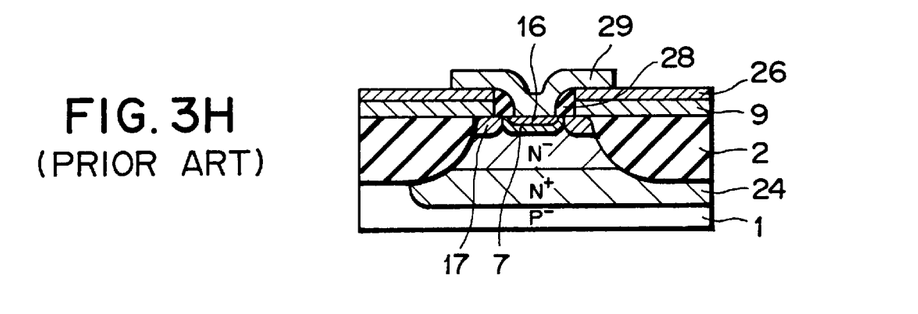

Next, as shown in FIG. 3H, after forming a second polycrystalline silicon film 29 on the entire surface of the substrate, arsenic ions are injected into the second polycrystalline silicon film 29, and the second polycrystalline silicon film 29 is etched by using the patterned resist as mask. In succession, by heating in a non-oxidizing atmosphere, the arsenic is diffused into the base region 7 from within the second polycrystalline silicon film 29, and an emitter diffusion layer 16 is formed.

In the prior at shown in FIG. 3A through FIG. 3H, however, although a fine emitter area or base area can be preserved, and, in addition to high integration, it is possible to improve electric characteristics due to decrease of parasitic capacity and realize low power consumption. However, there is a problem that because the device structure is complicated in this prior art, the number of processes is about 1.5 times more than that of FIGS. 1A to 1F, and the process conditions are severe, the yield is low, and hence the cost is higher.

In this prior art, although the merit of realizing the tiny dimension smaller than the minimum dimension at excellent controllability by the photolithographic technology being employed is outstanding, at further smaller size, the film thickness of the polycrystalline silicon at the emitter opening becomes thicker, and the base width is extended until the arsenic injected by ion implantation diffuses in the polysilicon and reaches the base region. The emitter resistance is also higher, and the characteristics deteriorate on the whole, and high speed device forming is disabled. As the countermeasure, at the present, arsenic-doped polycrystalline silicon is used, but as compared with ion implantation, uniformity in the surface of substrate is poor, which may lead to fluctuations of characteristics.

In the prior art shown in FIG. 1A to FIG. 1F and FIG. 2A to FIG. 2F, from its device structure, the number of processes is small and a high yield is expected, but the base area is determined automatically by the deviation margin between the opening (contact) and metal for metal wiring, and interval between metal and metal, and at the present it is about two times as wide as in prior art shown in FIGS. 3A to 3H, and it is not easy to form finely, and hence it is inferior in the aspects of low power consumption and high integration. However, the emitter area depends on the lithographic technology being employed.

SUMMARY OF THE INVENTION

It is an object of the invention to present a semiconductor device realizing a fine emitter and base area, substantially decreased in various junction capacities, low in power consumption, and excellent in high speed operation, and manufacturing method of the same.

A semiconductor device according to the present invention comprises, a semiconductor substrate; a base region formed on the surface of said substrate; a polycrystalline silicon film formed on the base region and separated into N type region and P type region; an external base layer and an emitter diffusion layer formed by diffusion of impurity from said polycrystalline silicon film into said base region; and a polyside film formed on the surface of the polycrystalline silicon layer so as to construct a base electrode and an emitter electrode.

A manufacturing method of semiconductor device according to the present invention comprises the steps of: removing a part of said oxide film on a base region to form an opening for contact; depositing a polycrystalline silicon film directly on said opening; dry-etching the polycrystalline silicon film on the base region so as to divide into a region including an impurity of the same conductive type as the base region, and a region including an impurity of reverse conductive type of the base region; heating to diffuse the impurity from the polycrystalline silicon film to the base region, thereby forming an external base layer and an emitter layer; and forming the surface of the polycrystalline silicon film into polyside film to lower the resistance, thereby forming the polycrystalline silicon film as emitter electrode and base electrode.

A manufacturing method of semiconductor device according to another aspect of the present invention comprises the steps of: oxidizing a part of a semiconductor substrate by selective oxidation to form a field region; injecting an impurity of reverse conductive type of the semiconductor substrate in part of the semiconductor substrate to form a collector draw-out region; implanting ions at high energy, using a photo resist formed by photolithographic technology as mask, to form an N well region and a P type element separation region; injecting a P type impurity into the entire surface of a substrate to form a base region, and removing a part of silicon oxide film on the surface to form an opening; sequentially depositing a polycrystalline silicon film, a silicon oxide film, and a silicon nitride film by chemical vapor deposition (CVD) method, and implanting ions by using a resist pattern formed by photolithographic technology as mask, and forming an N type region and a P type region in said polycrystalline silicon film; dividing said polycrystalline silicon film into said N type region and P type region by anisotropic dry etching by using a resist as mask; injecting ion at a base forming condition using a resist as a mask; oxidizing the side wall of the polycrystalline silicon film by using the nitride film on the substrate surface as mask; removing the nitride film, forming metal on the substrate surface by sputtering technology, and heating to transform the surface of the polycrystalline silicon film into polyside film; forming an interlayer film on the entire surface of the substrate; and forming an opening for contact by dry etching in an interlayer film, and connecting with the metal wiring.

Said opening forming step may be to form an opening on the base region. The interlayer film forming step may be to deposit a non-doped oxide film by chemical vapor deposition method, and deposit continuously an oxide film containing boron and phosphorus (BPSG) to form an interlayer film.

According to a manufacturing method of semiconductor device of the present invention, one opening is formed on a base region, a polycrystalline silicon formed thereon is separated into an N type region and a P type region, impurities are diffused from this polycrystalline silicon to form an external base layer and an emitter diffusion layer, the surface of the polycrystalline silicon is formed into polyside to lower the resistance so as to be used as base electrode and emitter electrode, respectively, and therefore the base and emitter area is smaller, the junction capacity of emitter-base and base-collector is reduced, so that a bipolar transistor of low power consumption and excellent high speed operation is formed.

BRIEF DESCRIPTION OF THE DRAWINGS

FIGS. 1A to FIG. 1F are sectional views showing a conventional manufacturing method in the sequence of steps;

FIGS. 2A to FIG. 2F are plan views thereof;

FIGS. 3A to FIG. 3H are sectional views showing other conventional manufacturing method in the sequence of steps;

FIGS. 4A to FIG. 4G are sectional views of a method of an embodiment of the invention in the sequence steps;

FIGS. 5A to FIG. 5G are plan views of FIGS. 4A to FIG. 4G respectively; and

FIGS. 6A to FIG. 6E are partially enlarged views of FIGS. 4D to FIG. 4H.

DESCRIPTION OF THE PREFERRED EMBODIMENT

A preferred embodiment of the present invention is described below specifically referring to the attached drawings. FIG. 4A to FIG. 4G and FIG. 5A to FIG. 5D are drawings showing a manufacturing method of semiconductor device in a preferred embodiment of the invention in the sequence of steps, and FIG. 4A to FIG. 4G are sectional views along line A—A in FIG. 5A. FIG. 6A to FIG. 6E are partially enlarged views of FIG. 4D to FIG. 4F.

Figure 4A:
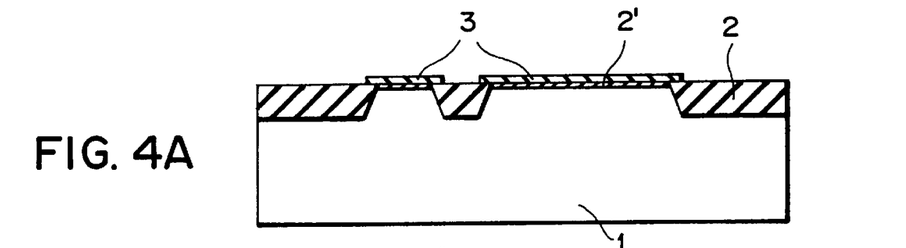
Figure 5A:
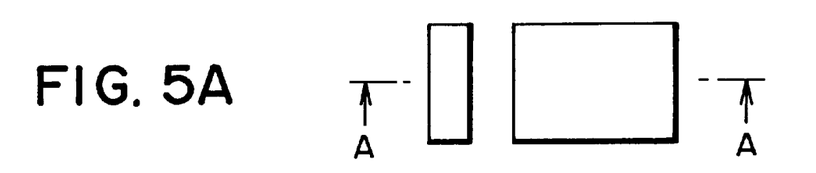

As shown in FIG. 4A and FIG. 5A, after forming a pad oxide film 2' of several hundred Å on the surface of a P type semiconductor substrate 1 by thermal oxidation, a silicon nitride film 3 of about 0.1 to 0.2 $\mu$m is deposited on the entire surface of the substrate by chemical vapor deposition. In succession, using a photo resist formed by a known photolithographic technology as mask, the silicon nitride film 3 is removed except for specified region, and selective oxidation is done by using the remaining silicon nitride film 3, and a field region (thermal oxide film) 2 is formed.

Figure 4B:
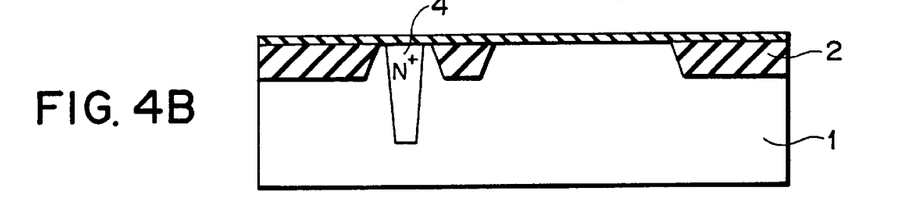
Figure 5B:
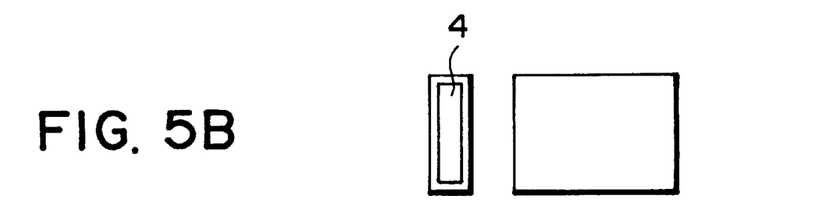

Then, as shown in FIG. 4B and FIG. 5B, after removing all silicon nitride film 3 from the substrate surface, using a resist formed by photolithographic technology as mask, N type impurity, herein, phosphorus is injected by ion implantation, and by heat treatment after removing the resist, an $N^+$ collector draw-out region 4 having a junction depth of 1.0 to 1.5 $\mu$m is formed.

Figure 4C:
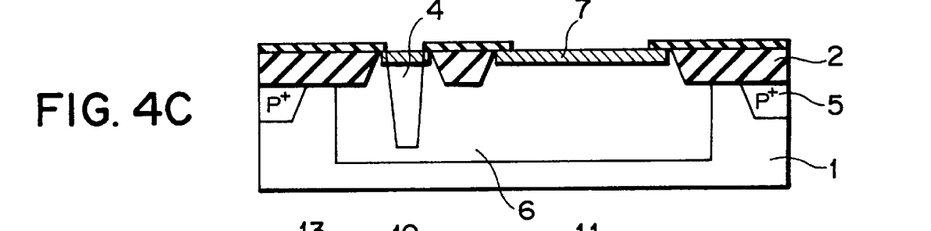
Figure 5C:
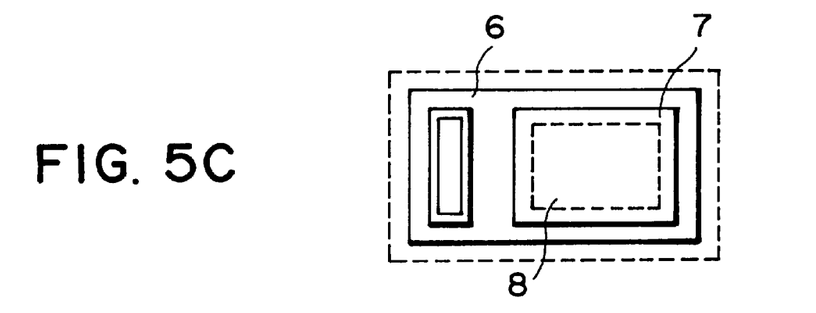

Next, as shown in FIG. 4C and FIG. 5C, using other resist as mask, boron is injected by ion implantation as P type impurity, and by heat treatment after removing the resist, a P type element separation region 5 is formed. In succession, using other photo resist as mask, an N type impurity, in particular, phosphorus is injected by using a high acceleration ion implantation apparatus of 1.0 to 1.5 mega-electron-volts (MeV), and an N well region 6 is formed. This process corresponds to the process of forming $N^+$ buried diffusion layer and $N^-$ epitaxial growth layer in the prior art, and a slant profile having a peak concentration around 1.2 to 1.8 $\mu$m is shown. After removing the resist successively, by injecting boron as P type impurity on the entire surface of the substrate by ion implantation, a base region 7 is formed as being enclosed by the field region 2. In this case, incidentally, boron is similarly injected on the collector draw-out region 4, but since the concentration difference is more than 100 times, it has almost no effect.

Figure 4D:
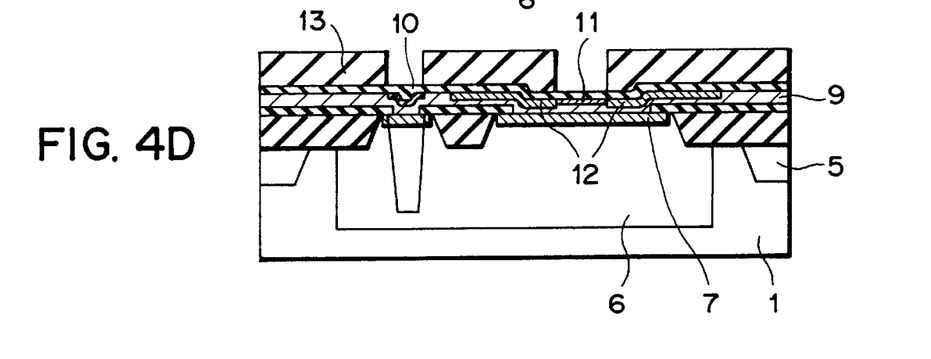
Figure 5D:
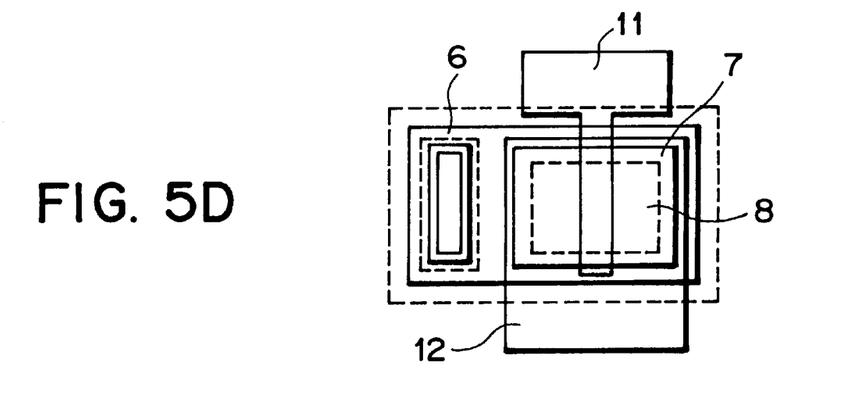
Figure 6A:
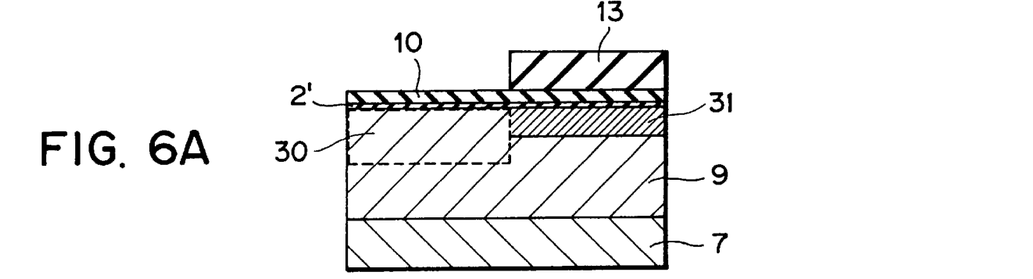

Consequently, as shown in FIG. 4D, FIG. 5D and FIG. 6A, by removing the oxide film from part of the base region 7 and collector draw-out region 4, openings (contacts) are formed. Then, after depositing a polycrystalline silicon film 9 of 1000 to 2000 Å by CVD technology on the entire surface of the substrate, a P type region 30 or 12 injected boron as P type impurity by ion implantation is formed in part of the polycrystalline silicon film 9 on the base by using a resist 13 formed by photolithographic technology as a mask, and arsenic ions are implanted in other region as N type impurity to form an N type region 31 or 11. By CVD method, an oxide film of 100 to 200 Å and a nitride film of 1000 to 2000 Å are sequentially deposited continuously. In the drawings, reference numeral 10 is a laminate of nitride film/oxide film, 11 is an N type region (emitter arsenic region 11) of polycrystalline silicon on the base region, and 12 is a P type region (external base 12) of polycrystalline silicon on the base region.

Figure 4E:
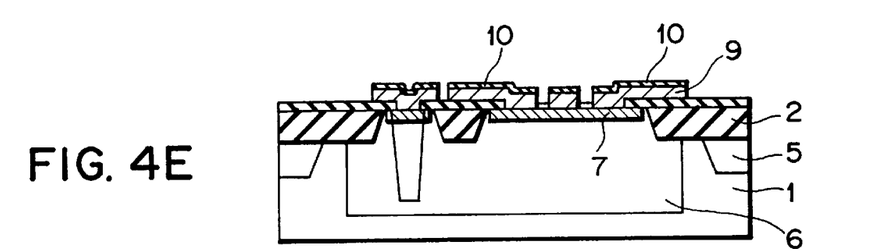
Figure 5E:
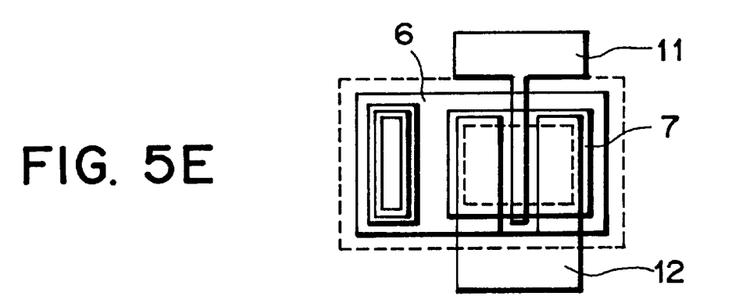
Figure 6B:
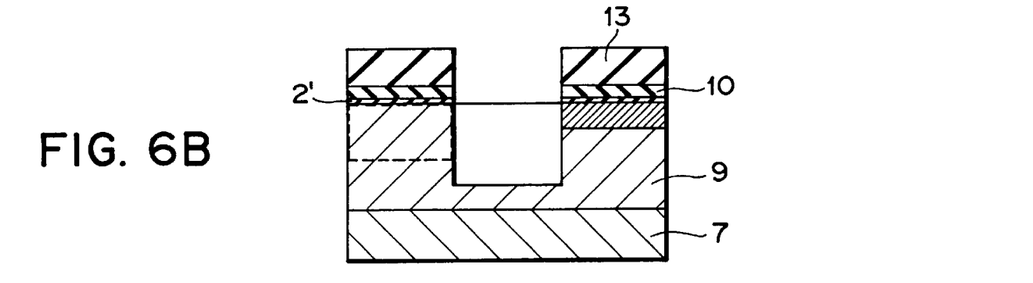
Figure 6C:
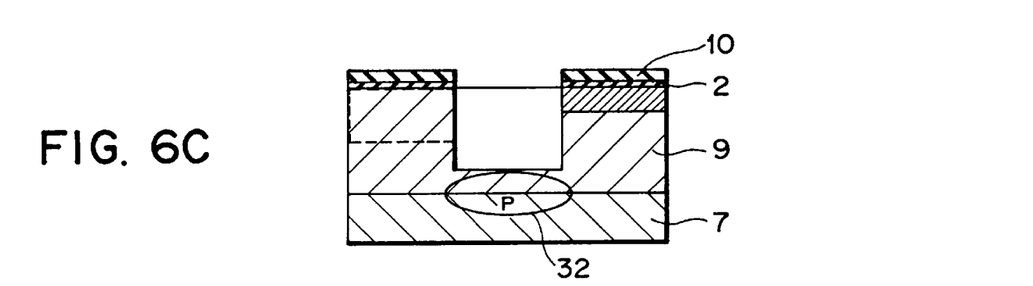

Then, as shown in FIGS. 4E, FIG. 5E, and FIG. 6B, using, as mask, a photo resist patterned so as to be etched and removed a boundary area of N type region (emitter arsenic region 11) and P type region (external base 12) of polycrystalline silicon on the base region, the nitride film and oxide film 10 and polycrystalline silicon film 9 in FIG. 4D, FIG. 5D, and FIG. 6A are sequentially removed continuously by anisotropic dry etching. At this time, in order to prevent etching and removing of the lower base region to heighten the base resistance, the polycrystalline silicon film 9 is left over by about 100 to 300 Å. However, considering uniformity of dry etching in the plane, in order to prevent the base resistance from heightening even if the lower base region is etched and removed, base correction implantation is done for executing ion implantation in the base forming condition at injection angle of 0° (zero degree) using a resist for etching polycrystalline silicon film 9 as mask for ion implantation to form a base correction region 32 (FIG. 6C).

Figure 4F:
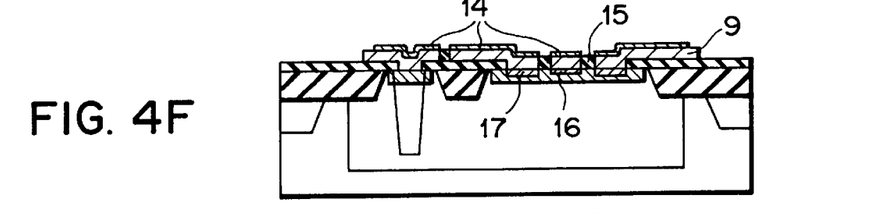
Figure 5F:
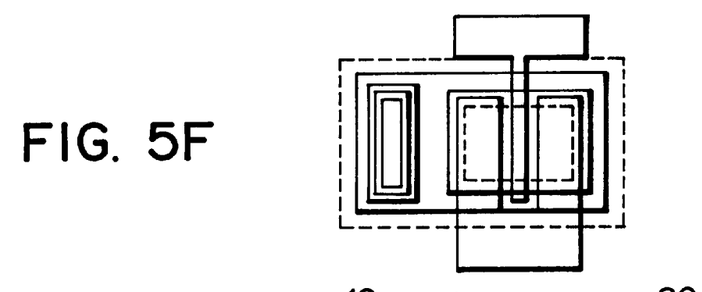
Figure 6D:
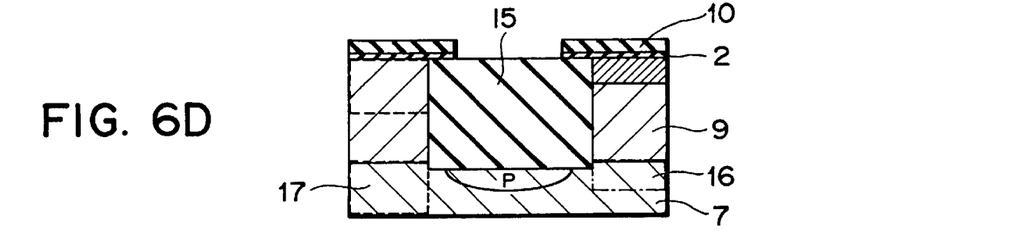

As shown in FIG. 4F, FIG. 5F, and FIG. 6D, after removing the resist 13, using the nitride film 10 on the substrate surface as mask, the polycrystalline silicon film left over on the side wall of the polycrystalline silicon film 9 and bottom of etching portion is oxidized. At this time, if the size (width) of the etching portion of the polycrystalline silicon film 9 is 0.3 $\mu$m or less, the inside of the etching portion is filled with the oxide film formed by oxidation, but if larger than 0.3 $\mu$m, after oxidizing the polycrystalline silicon film 9, an oxide film is further deposited by CVD method, and the oxide film is removed and flattened by CMP (chemical mechanical polishing). Besides, since the oxidation process is done in two steps in oxidizing atmosphere and non-oxidizing atmosphere, the impurity is diffused from the polycrystalline silicon film 9 to the base region 7, and external base layers 17 and emitter diffusion layers 16 are formed respectively.

Figure 6E:
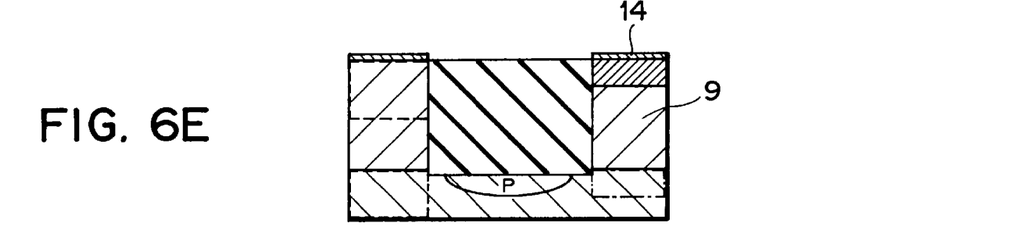

As shown in FIG. 4F, FIG. 5F, and FIG. 6E, after removing the nitride film and oxide film 10, by employing a sputtering technology, metal is formed on the substrate surface, and heat treatment is applied, so that the surface of the polycrystalline silicon film 9 is formed into polyside, and the resistance is lowered by forming a polyside layer 14, and the polycrystalline silicon film 9 is used as part of emitter electrode 11 and base electrode 12.

Figure 4G:
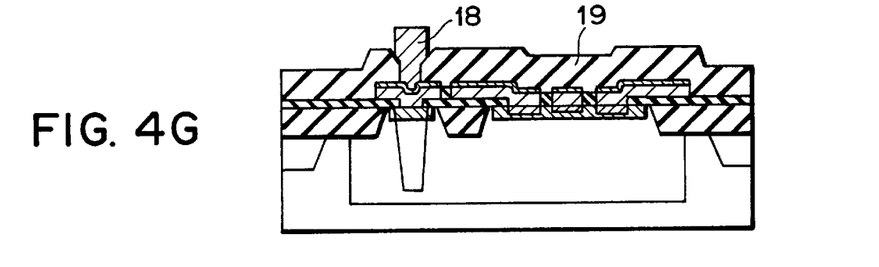
Figure 5G:
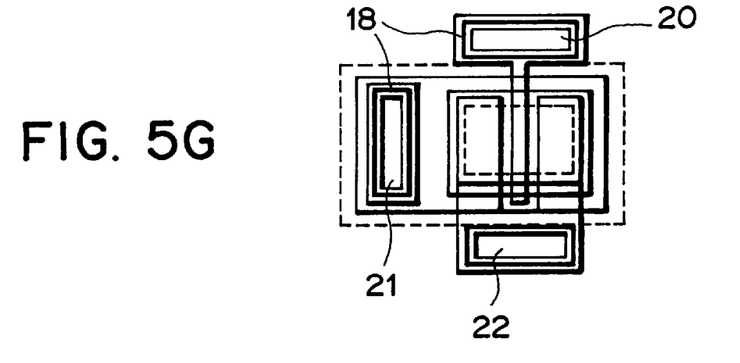

Finally, as shown in FIG. 4G and FIG. 5G, a non-doped oxide film of several thousand Å is deposited by CVD method, and an oxide film containing boron and phosphorus (BPSG) is deposited continuously to form an interlayer film 19, and openings (contacts) 21, 22, 23 are formed in the interlayer film 19 by dry etching, and by connecting with metal wiring 18, a semiconductor device of the invention is completed.

According to the invention thus explained, one opening is formed on the base region, and the polycrystalline silicon film formed thereon is separated into N type region and P type region, the impurity is diffused from this polycrystalline silicon film to the base region to form external base layer and emitter diffusion layer. Then, the surface of the polycrystalline silicon film is formed into polyside film to lower the resistance so as to be used as the base electrode and emitter electrode. Therefore, according to the present invention, the base area and emitter area are reduced, the junction capacity of the emitter-base and base-collector is substantially decreased, and a bipolar transistor of low power consumption and excellent high speed operation is formed.

Since it is almost same as in gate forming of CMOS, the structure is simple and a high yield is expected, and the manufacturing process is about 40% shorter than in the prior art, and a substantial cost reduction is expected.

In addition, the element area is about ½ of the prior art, and integration at higher density is possible, and the chip size is smaller and a further cost reduction is expected.

As a result, a bipolar transistor having a fine emitter and base area, substantially decreased in each junction capacity, low in power consumption, and excellent in high speed operation is formed.

What is claimed is:

1. A manufacturing method of semiconductor device comprising oxidizing a part of a semiconductor substrate by selective oxidation to form a field region;

forming a silicon oxide film over the surface of the substrate injecting an impurity of reverse conductive type of the semiconductor substrate in part of the semiconductor substrate to form a collector draw-out region;

implanting ions at high energy, using a photo resist formed by photolithography as a mask, to form an N well region and a P type element separation region;

injecting a P type impurity into the entire surface of a substrate to form a base region, and removing a part of said silicon oxide film on the surface to form an opening;

sequentially depositing a polycrystalline silicon film, a silicon oxide film, and a silicon nitride film by chemical vapor deposition (CVD), and implanting ions by using a resist pattern formed by photolithography as a mask, and forming an N type region and a P type region in said polycrystalline silicon film;

dividing said polycrystalline silicon film into said N type region and P type region by anisotropic dry etching by using a resist as a mask; injecting ions using a resist as a mask into a base region to form a base correction region;

oxidizing the side wall of the polycrystalline silicon film by using the nitride film on the substrate surface as a mask;

removing the nitride film, forming metal on the substrate surface by sputtering, and heating to transform the surface of the polycrystalline silicon film into polyside film;

forming an interlayer film on the entire surface of the substrate; and forming an opening for contact by dry etching in an interlayer film, and connecting with the metal wiring.

2. A manufacturing method of semiconductor device according to claim 1, wherein the forming of the opening forms an opening on the base region.

3. A manufacturing method of semiconductor device of claim 1, wherein the forming of the interlayer film deposits a non-doped oxide film by chemical vapor deposition, and deposits continuously an oxide film containing boron and phosphorus (BPSG) to form the interlayer film.

* * * * *